US006822991B2

(12) United States Patent
Collins, III et al.

(10) Patent No.: US 6,822,991 B2
(45) Date of Patent: Nov. 23, 2004

(54) LIGHT EMITTING DEVICES INCLUDING TUNNEL JUNCTIONS

(75) Inventors: William D. Collins, III, San Jose, CA (US); Nathan F. Gardner, Mountain View, CA (US); Arto V. Nurmikko, Providence, RI (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 10/261,534

(22) Filed: Sep. 30, 2002

(65) Prior Publication Data

US 2004/0066816 A1 Apr. 8, 2004

(51) Int. Cl.[7] .................................................. H01S 5/00
(52) U.S. Cl. .............................. 372/43; 372/45; 257/96
(58) Field of Search ............................ 372/43, 45, 96; 257/96

(56) References Cited

U.S. PATENT DOCUMENTS

| | | | |
|---|---|---|---|
| 4,169,997 A | 10/1979 | Logan et al. ............... 331/94.5 |
| H667 H | * 9/1989 | Bedair et al. ............... 136/249 |
| 5,365,536 A | * 11/1994 | Seki ........................ 372/45 |
| 5,376,580 A | 12/1994 | Kish et al. ................ 437/127 |
| 5,452,316 A | 9/1995 | Seki et al. ................. 372/46 |
| 5,684,309 A | 11/1997 | McIntosh et al. ........... 257/191 |
| 5,851,905 A | * 12/1998 | McIntosh et al. ........... 438/492 |
| 6,153,894 A | * 11/2000 | Udagawa .................. 257/96 |
| 6,487,231 B1 | * 11/2002 | Boucart et al. ............. 372/96 |

OTHER PUBLICATIONS

Tetsuya Takeuchi et al., "GaN–Based Light Emiiting Diodes with Tunnel Junctions", Japanese Journal of Applied Physics, vol. 40 (2001) pp. L861–L863, Part 2, No. 8B, Aug. 15, 2001.

Seong–Ran Jeon et al., "Lateral Current Spreading in GaN–Based Light–Emitting Diodes Utilizing Tunnel Contact Junctions," Applied Physics Letters, vol. 78, No. 21, May 21, 2001, pp. 3265–3267.

Xia Guo et al., "Tunnel–Regenerated Multiple–Active–Region Light–Emitting Diodes with High Efficiency," Applied Physics Letters, vol. 79, No. 18, Oct. 29, 2001, pp. 2985–2986.

* cited by examiner

Primary Examiner—Don Wong
Assistant Examiner—Hung T Vy
(74) Attorney, Agent, or Firm—Patent Law Group LLP; Rachel V. Leiterman

(57) ABSTRACT

A light emitting device includes a first active region, a second active region, and a tunnel junction. The tunnel junction includes a layer of first conductivity type and a layer of second conductivity type, both thinner than a layer of first conductivity type and a layer of second conductivity type surrounding the first active region. The tunnel junction permits vertical stacking of the active regions, which may increase the light generated by a device without increasing the size of the source.

26 Claims, 5 Drawing Sheets

LIGHT EMITTING DEVICES INCLUDING TUNNEL JUNCTIONS

BACKGROUND

1. Field of Invention

This invention relates to semiconductor light emitting devices and, in particular, to semiconductor light emitting devices incorporating tunnel junctions.

2. Description of Related Art

Semiconductor light-emitting devices including light emitting diodes (LEDs), vertical resonant cavity light emitting diodes (VRCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III–V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region.

Mg-doped III-nitride layers tend to be highly resistive, requiring high voltage drop in order to provide enough positive charge carriers (holes) in the active region. In addition, current tends to concentrate in the most direct paths from the p-contact to the active region. Accordingly, device designs which increase current spreading, particularly in the p-type layers, are advantageous.

Semiconductor light emitting devices are often incorporated into systems, such as projectors and optical scanning devices, that include optics such as lenses. The cost of such optics tends to increase with increasing size, thus device designs that increase brightness without increasing size are desirable.

SUMMARY

In accordance with an embodiment of the invention, a light emitting device includes a first active region, a second active region, and a tunnel junction. The tunnel junction includes a layer of first conductivity type and a layer of second conductivity type, both thinner than a layer of first conductivity type and a layer of second conductivity type surrounding the first active region. The tunnel junction permits vertical stacking of the active regions, which may increase the light generated by a device without increasing the size of the source.

DETAILED DESCRIPTION

The examples described below are III-nitride light emitting devices. The semiconductor layers of III-nitride devices have the general formula $Al_xIn_yGa_zN$, where $0 \leq x \leq 1$, $0 \leq y \leq 1$, $0 \leq z \leq 1$, $x+y+z=1$. III-nitride device layers may further contain group III elements such as boron and thallium and may have some of the nitrogen may be replaced by phosphorus, arsenic, antimony, or bismuth. Though the examples below describe III-nitride devices, embodiments of the invention may also be fabricated in other III–V materials systems including III-phosphide and III-arsenide, II–VI material systems, and any other materials systems suitable for making light emitting devices.

Figure 1A:
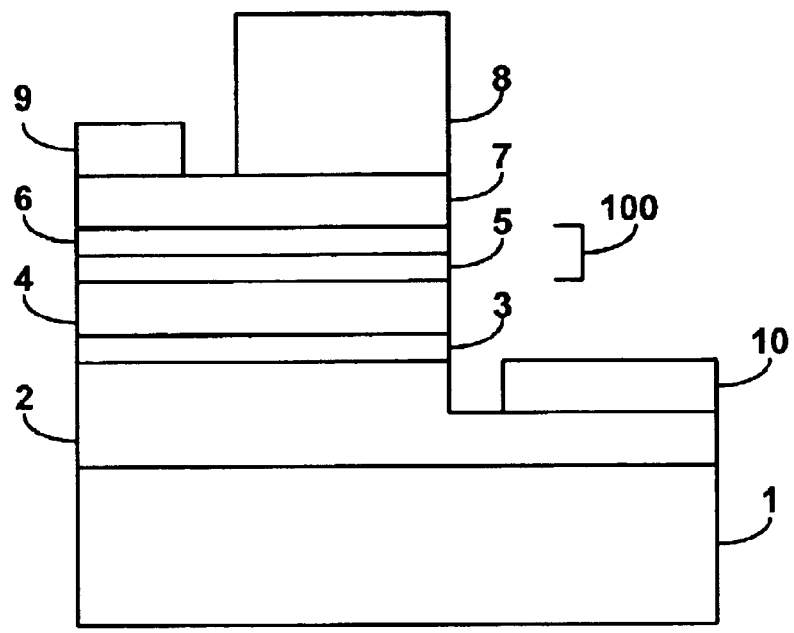
FIGS. 1A and 1B illustrate single active region devices incorporating tunnel junctions, according to embodiments of the present invention.

FIG. 1A illustrates a light emitting device with a single light emitting region, according to an embodiment of the invention. The device shown in FIG. 1A is a VRCLED or VCSEL incorporating a tunnel junction as a hole spreading layer. A light emitting active region 3 separates an n-type layer 2 and a p-type layer 4. Active region 3 may be, for example, a single light emitting layer or a multiple quantum well structure of alternating quantum well layers and barrier layers, such as a separate confinement heterostructure, described in more detail in application Ser. No. 10/033,349, titled "Indium Gallium Nitride Separate Confinement Heterostructure Light Emitting Devices," filed Nov. 2, 2001, and incorporated herein by reference. The n-type layer may be, for example, AlGaN doped with Si; the p-type layer 4 may be, for example, AlGaN doped with Mg; and the active region may be, for example, an InGaN multiple quantum well structure. A tunnel junction 100 is formed over p-type layer 4.

Tunnel junction 100 includes a highly doped p-type layer 5, also referred to as a p++ layer, and a highly doped n-type layer 6, also referred to as an n++ layer. P++ layer 5 may be, for example, InGaN or GaN, doped with an acceptor such as Mg or Zn to a concentration of about $10^{18}$ cm$^{-3}$ to about $5 \times 10^{20}$ cm$^{-3}$. In some embodiments, p++ layer 5 is doped to a concentration of about $2 \times 10^{20}$ cm$^{-3}$ to about $4 \times 10^{20}$ cm$^{-3}$. N++ layer 6 may be, for example, InGaN or GaN, doped with an acceptor such as Si or Ge to a concentration of about $10^{18}$ cm$^{-3}$ to about $5 \times 10^{20}$ cm$^{-3}$. In some embodiments, n++ layer 6 is doped to a concentration of about $7 \times 10^{19}$ cm$^{-3}$ to about $9 \times 10^{19}$ cm$^{-3}$. Tunnel junction 100 is usually very thin, for example tunnel junction 100 may have a total thickness ranging from about 2 nm to about 100 nm, and each of p++ layer 5 and n++ layer 6 may have a thickness ranging from about 1 nm to about 50 nm. In some embodiments, each of p++ layer 5 and n++ layer 6 may have a thickness ranging from about 25 nm to about 35 nm. P++ layer 5 and n++ layer 6 may not necessarily be the same thickness. In one embodiment, p++ layer 5 is 15 nm of Mg-doped InGaN and n++ layer 6 is 30 nm of Si-doped GaN. P++ layer 5 and n++ layer 6 may have a graded dopant concentration. For example, a portion of p++ layer 5 adjacent to the underlying p-layer 4 may have a dopant concentration that is graded from the dopant concentration of the underlying p-type layer to the desired dopant concentration in p++ layer 5. Similarly, n++ layer 6 may have a dopant concentration that is graded from a maximum adjacent to p++ layer 5 to a minimum adjacent to n-type layer 7. Tunnel junction 100 is fabricated to be thin enough and doped enough such that tunnel junction 100 displays low series voltage drop when conducting current in reverse-biased mode. In some embodiments, the voltage drop across tunnel junction 100 is about 0.1V to about 1V.

A second n-type layer 7 is formed over tunnel junction 100. A positive electrical contact 9 is attached to n-type layer 7 and a negative electrical contact 10 is attached to n-type layer 2. The device shown in FIG. 1A is a VRCLED or a VCSEL, thus it also includes a bottom distributed Bragg reflector (DBR) 1 under n-type layer 2. DBR 1 may be a dielectric or it may be formed in-situ of III-nitride materials. A top DBR 8 is formed on n-type layer 7. As is clear to a person of skill in the art, the device shown in FIG. 1A may be fabricated as a light emitting diode, without DBRs 1 and 8.

Tunnel junction 100 is fabricated such that when a voltage drop is applied across contacts 9 and 10 such that the p-n junction between active region 3 and p-type layer 4 is forward biased, tunnel junction 100 quickly breaks down and conducts in the reverse-bias direction with a minimal voltage drop. The layers in tunnel junction 100 are thin enough and doped enough that charge carriers can tunnel through them. Each of the layers in tunnel junction 100 need not have the same composition, thickness, or dopant composition. Tunnel junction 100 may also include an additional layer between p++ layer 5 and n++ layer 6 that contains both p- and n-type dopants.

Tunnel junction 100 acts as a hole spreading layer to distribute positive charge carriers in p-type layer 4. Carriers in n-type III-nitride material have a much longer diffusion length than carriers in p-type III-nitride material, thus current can spread more readily in an n-type layer than a p-type layer. Since current spreading on the p-side of the p-n junction occurs in n-type layer 7, the device illustrated in FIG. 1B may have better p-side current spreading than a device lacking a tunnel junction.

A single light emitting region device incorporating a tunnel junction may also be simpler to fabricate than a similar device without the tunnel junction. Since both contacts 9 and 10 are formed on n-type layers 2 and 7, contacts 9 and 10 may be the same material, potentially eliminating from the fabrication process some deposition and etching steps required when different contact materials must be applied to the p- and n-layers of the device.

Figure 1B:
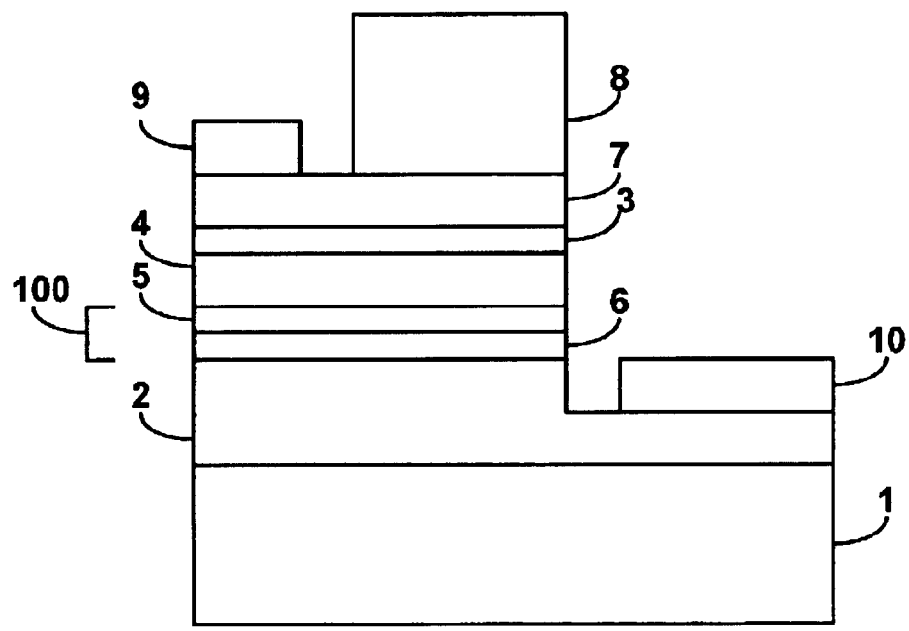

FIG. 1B illustrates an alternative embodiment of a single light emitting region device. Tunnel junction 100 is located beneath the active region, rather than above the active region as in the embodiment shown in FIG. 1A. Tunnel junction 100 is located between n-type layer 2 and p-type layer 4. Thus, the polarity of the device in FIG. 1B is the opposite of the polarity of the device in FIG. 1A. Tunnel junction 100 of FIG. 1B also serves as a hole spreading layer by distributing positive charge carriers in p-type layer 4.

Figure 2:
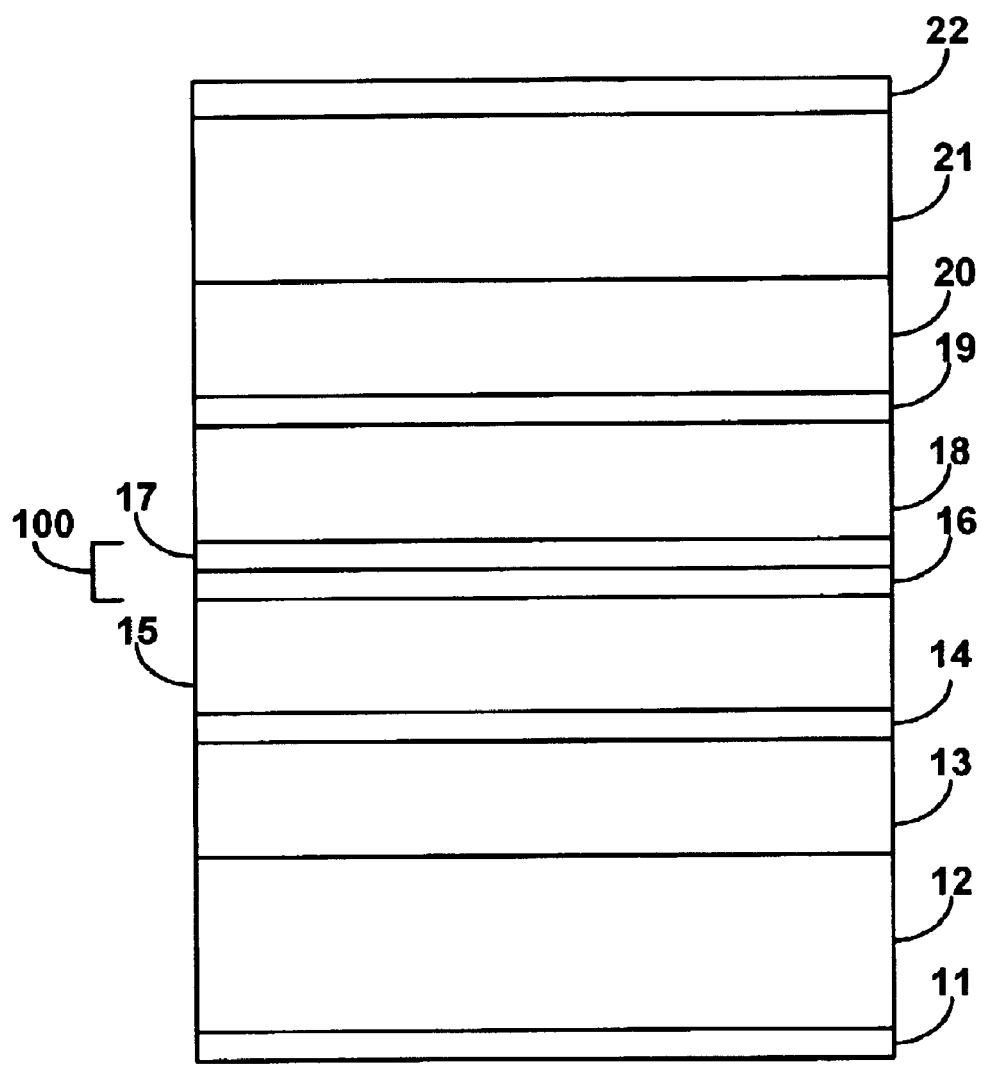
FIG. 2 illustrates a multiple active region, two contact embodiment of the present invention.

FIG. 2 illustrates an embodiment of a light emitting device with multiple light emitting regions separated by tunnel junctions. The device shown in FIG. 2 includes a bottom contact 11, a bottom DBR 12, a first active region 14 sandwiched between a first n-type layer 13 and a first p-type layer 15, a second active region 19 sandwiched between a second n-type layer 18 and a second p-type layer 20, a top DBR 21, and a top contact 22. A tunnel junction 100, including a p++ layer 16 and an n++ layer 17 separates the two active regions 14 and 19. P++ layer 16 is adjacent to first p-type layer 15 and n++ layer 17 is adjacent to second n-type layer 18. Tunnel junction 100 may have the same characteristics as the tunnel junctions described above in reference to FIGS. 1A and 1B. The device shown in FIG. 2 may be formed on a conducting growth substrate such as SiC, such that the substrate separates contact 11 and DBR 12. Alternatively, layers 13–21 may be formed on an insulating substrate which is later removed. DBR 12 and contact 11 may be attached to layer 13 by, for example, wafer bonding. The device shown in FIG. 2 is a VRCLED or VCLED. Like the embodiments illustrated in FIGS. 1A and 1B, the embodiment shown in FIG. 2 can easily be fabricated as a light emitting diode by omitting DBRs 12 and 21. In order to form both contacts on the same side of the device, a portion of the semiconductor layers may be etched away to expose a ledge on n-type layer 13, on which contact 11 may be formed.

Though two active regions are illustrated in FIG. 2, any number of active regions may be included between contacts 11 and 22, provided the p-type region adjacent each active region is separated from the n-type region adjacent the next active region by a tunnel junction. Since the device of FIG. 2 has only two contacts, both active regions 14 and 19 emit light at the same time and cannot be individually and separately activated. In one embodiment, a device may have enough junctions such that the device can operate at 110 volts.

Active regions 14 and 19 of FIG. 2 may be fabricated with the same composition, such that they emit the same color light, or with different compositions, such that they emit different colors (i.e. different peak wavelengths) of light. For example, a three active region device with two contacts may be fabricated such that the first active region emits red light, the second active region emits blue light, and the third active region emits green light. When activated, the device may produce white light. Since the active regions are stacked such that they appear to emit light from the same area, such devices may avoid problems with color mixing present in a device that combines red, blue, and green light from adjacent, rather than stacked, active regions. In a device with active regions emitting different wavelengths of light, the active region that generates light of the shortest wavelength may be located closest to the surface from which light is extracted, generally the sapphire, SiC, or GaN growth substrate in an LED. Placement of the shortest wavelength active region near the output surface may minimize loss due to absorption in the quantum wells of the other active regions and may reduce the thermal impact on more sensitive longer wavelength quantum wells by locating the longer wavelength active regions closer to the heat sink formed by the contacts. The quantum well layers may also be made sufficiently thin that absorption of light in the quantum well layers is low. The color of the mixed light emitted from the device may be controlled by selecting the number of active regions that emit light of each color. For example, the human eye is very sensitive to green photons and not as sensitive to red photons and blue photons. In order to create balanced white light, a stacked active region device may have a single green active region and multiple blue and red active regions.

Devices with multiple stacked active regions, such as the device shown in FIG. 2, may offer several advantages. First, when driven at the same current density as a similar device with a single active region, a multiple stacked active region device may operate at a higher voltage than a single active region device of the same area, due to the voltage drop required by the tunnel junctions separating the active regions. Operating at higher voltage may simplify the design and reduce the cost of power supplies and drivers.

Second, when operated at the same current density as a single active region device, a multiple stacked active region device may emit more light than a single active region device, while not requiring additional area. Increasing the brightness per area may reduce the cost of fabricating the device, because less substrate area is required for each device, thus more devices may be fabricated on a single substrate wafer. Also, higher brightness for a given area may reduce simplify the design and reduce the cost of secondary optics because the cost of optics tends to increase as the area of the optic increases.

Third, the presence of tunnel junctions separating the active regions may enhance current spreading in the device, which distributes carriers more evenly in the layers adjacent to each active region and thus permits more radiative recombinations of carriers in the active region.

Fourth, multiple junctions may be activated by a single pair of contacts, thus mitigating electromigration problems in the contacts and the amount of space consumed by the contacts. When III-nitride devices operate at high current, metal from the contacts can migrate into the semiconductor layers and cause reliability problems in the device. In a device with multiple lateral active regions, each time an active region is added, a set of contacts must be added, thus each time an active region is added the possibility of electromigration problems increases. In contrast, in a multiple stacked active region device, the addition of an active region does not require the addition of more contacts, thus the extent of the electromigration problem for a multiple stacked active region device is the same as a single active region device with the same contact area.

Figure 3:
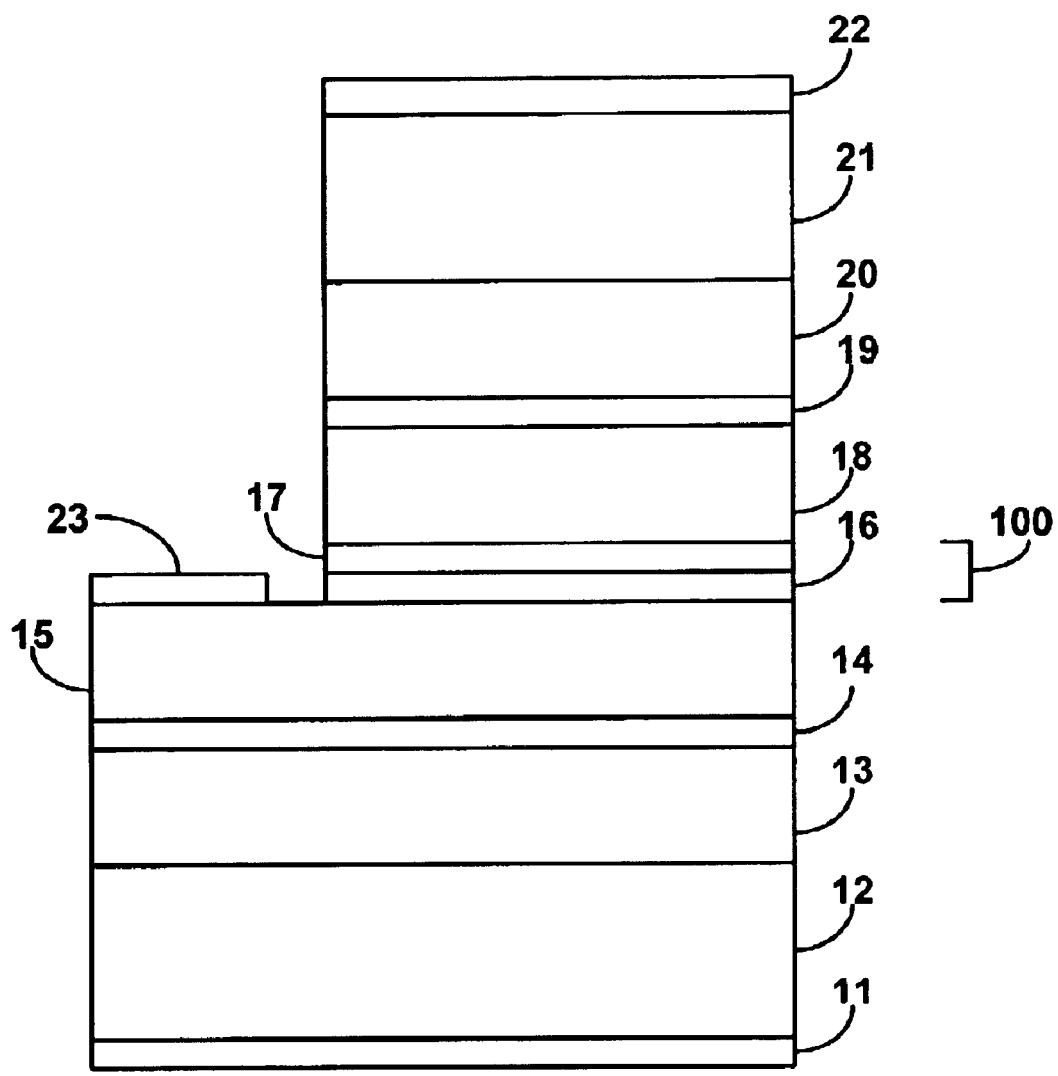
FIG. 3 illustrates a multiple active region, multiple contact embodiment of the present invention.

FIG. 3 illustrates an embodiment of the invention with multiple active regions and more than two contacts. Besides contacts 11 and 22 on the ends of the device, a contact 23 is formed on a ledge etched down to p-type layer 15. Alternatively, contact 23 may be connected to one of layers 16 and 17 in tunnel junction 100, or to n-type layer 18. Contact 23 makes active regions 19 and 14 independently addressable. When current is applied between contacts 11 and 22, both active regions emit light. When current is applied between contacts 23 and 22, only active region 19 emits light. When current is applied between contacts 23 and 11, only active region 14 emits light. In addition, contact 23 allows for modulation of the relative current flow through the different active regions. The ability to increase the current flow in some layers and decrease the current flow in other layers can be used to tune the color of the aggregate spectrum. In some embodiments, all contacts are formed on the same side of the device. In such embodiments, the contacts are formed on multiple ledges, each connecting to a different layer.

Figure 4:
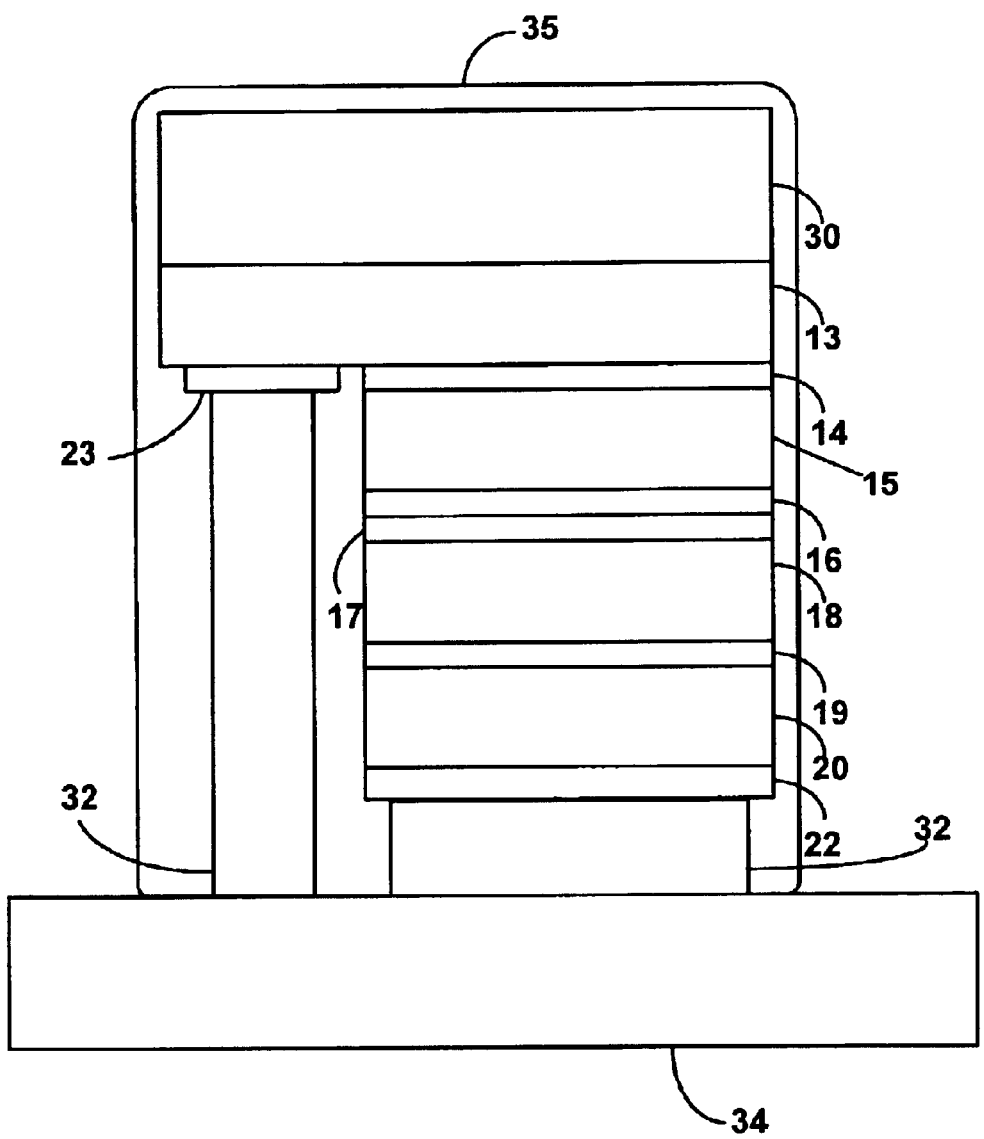
FIG. 4 illustrates a multiple active region, two contact embodiment of the present invention incorporating a wavelength converting material.

In some embodiments, part of the light emitted from one or more of the active regions in a multiple stacked active region device may be converted to a different wavelength by a wavelength converting material such as, for example, a phosphor. FIG. 4 illustrates a two active region device with a phosphor layer 35. The device shown in FIG. 4 is an LED formed on an insulating substrate 30. Interconnects 32, which may be, for example, solder, wires, or any other suitable connection, connect contacts 22 and 23 to a submount 34. The device shown in FIG. 4 is a flip chip, meaning that the device is "flipped" when mounted on the submount such that light is extracted through growth substrate 30. Phosphor layer 35 may be any suitable phosphor. Phosphor layer 35 may be formed for example over just the top of substrate 30, over the top and sides of substrate 30, or over the top and sides of substrate 30 and all or a portion of the sides of the semiconductor layers (shown in FIG. 4). Phosphor layer 35 may be thin enough such that only a portion of light emitted from active regions 14 and 19 are converted by phosphor 35. Phosphor layer 35 may contain scattering particles in addition to a fluorescent material. One or more phosphor layers may be used on a multiple stacked active region device to form white light. For example, active region 14 of FIG. 4 may produce blue light, active region 19 may produce cyan light, and phosphor 35 may be a doped Yttrium Aluminum Garnet (YAG) or SrS phosphor that converts some of the blue light to light having a wavelength from amber through red. The blue, cyan, and amber/red light combine to produce white light.

In another embodiment, the wavelength converting material is located between semiconductor layers, rather than applied to the surfaces of the substrate and semiconductor layers. In such an embodiment, some of the semiconductor layers are formed on a first substrate. The last layer applied over the semiconductor layers is a phosphor layer. The remaining semiconductor layers are formed on a second substrate. The second substrate is removed and the remaining semiconductor layers are wafer bonded to the phosphor layer. In still another embodiment, growth substrate 30 is a wavelength converting material, such as single crystal YAG.

In some embodiments, more than one multiple stacked active region device may be fabricated monolithically on a single substrate. Monolithic light emitting device arrays are described in more detail in application Ser. No. 09/823,824, filed Mar. 29, 2001, titled "Monolithic Series/Parallel LED Arrays Formed On Highly Resistive Substrates," and incorporated herein by reference.

Figure 5:
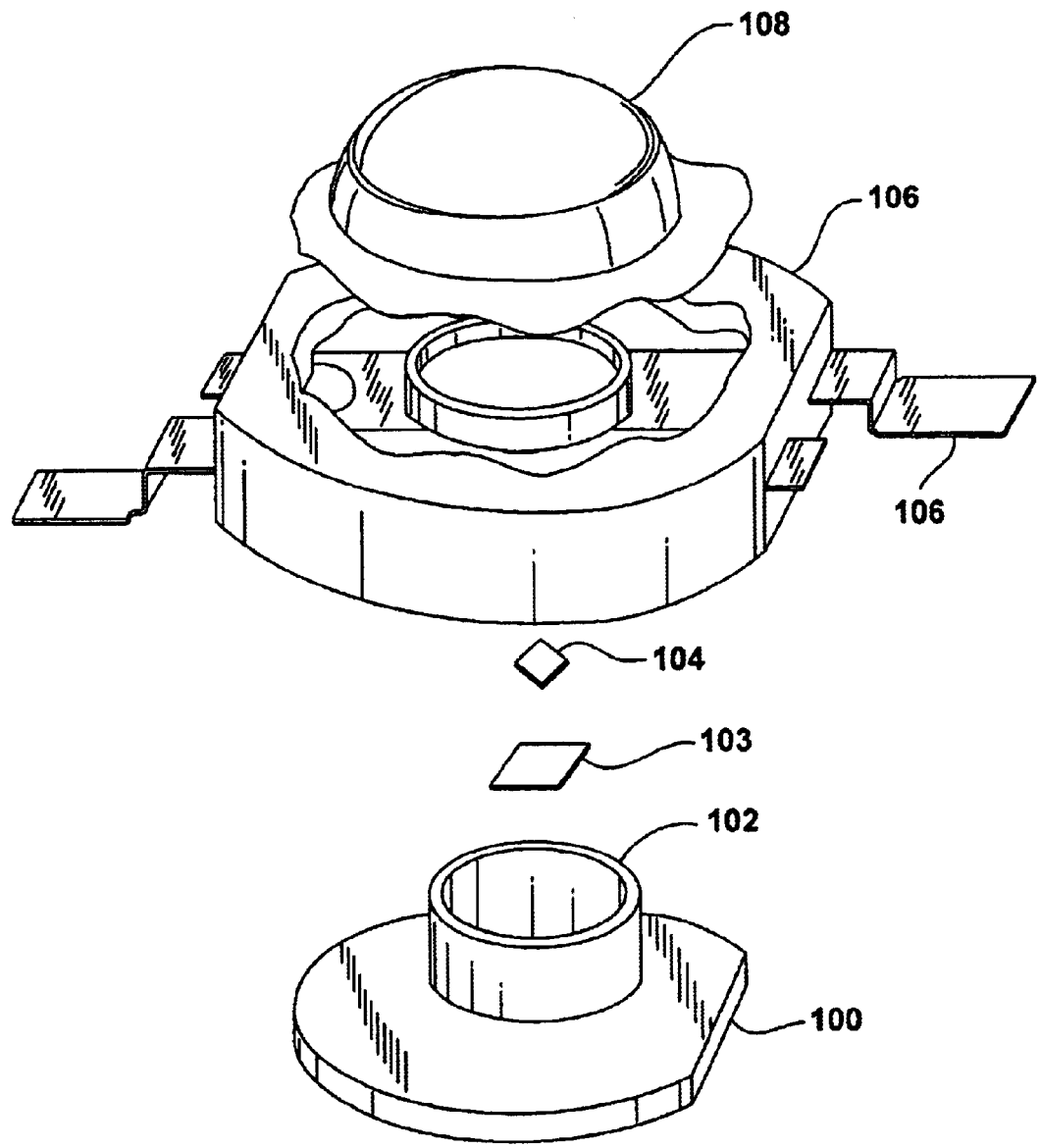
FIG. 5 illustrates a packaged light emitting device.

FIG. 5 is an exploded view of a packaged light emitting device. A heat-sinking slug 100 is placed into an insert-molded leadframe 106. The insert-molded leadframe 106 is, for example, a filled plastic material molded around a metal frame that provides an electrical path. Slug 100 may include an optional reflector cup 102. The light emitting device die 104, which may be any of the devices described above, is mounted directly or indirectly via a thermally conducting submount 103 to slug 100. An optical lens 108 may be added.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A III-nitride light emitting device comprising:
   a first layer of first conductivity type;
   a first layer of second conductivity type;
   a first active region disposed between the first layer of first conductivity type and the first layer of second conductivity type;
   a tunnel junction, the tunnel junction comprising:
      a second layer of first conductivity type having a dopant concentration greater than the first layer of first conductivity type; and
      a second layer of second conductivity type having a dopant concentration greater than the first layer of second conductivity type;
   a third layer of first conductivity type;
   a third layer of second conductivity type; and
   a second active region disposed between the third layer of first conductivity type and the third layer of second conductivity type;

wherein the tunnel junction is between the first active region and the second active region, the second layer of second conductivity type is adjacent to the first layer of second conductivity type, and the second layer of first conductivity type is adjacent to the third layer of first conductivity type; and wherein each semiconductor layer in the device is a III-nitride layer.

2. The device of claim 1 wherein:

the second layer of first conductivity type has a dopant concentration ranging from about $10^{18}$ cm$^{-3}$ to about $5 \times 10^{20}$ cm$^{-3}$; and the second layer of second conductivity type has a dopant concentration ranging from about $10^{18}$ cm$^{-3}$ to about $5 \times 10^{20}$ cm$^{-3}$.

3. The device of claim 1 wherein the second layer of first conductivity type has a dopant concentration ranging from about $2 \times 10^{20}$ cm$^{-3}$ to about $4 \times 10^{20}$ cm$^{-3}$.

4. The device of claim 1 wherein the second layer of second conductivity type has a dopant concentration ranging from about $7 \times 10^{19}$ cm$^{-3}$ to about $9 \times 10^{19}$ cm$^{-3}$.

5. The device of claim 1 wherein the tunnel junction has a voltage drop ranging from between about 0V to about 1V when operated in reverse-biased mode.

6. The device of claim 1 wherein the tunnel junction has a voltage drop ranging from between about 0.1V to about 1V when operated in reverse-biased mode.

7. The device of claim 1 wherein:

the second layer of first conductivity type has a thickness ranging from about 1 nm to about 50 nm; and the second layer of second conductivity type has a thickness ranging from about 1 nm to about 50 nm.

8. The device of claim 1 wherein the tunnel junction has a thickness ranging from about 2 nm to about 100 nm.

9. The device of claim 1 wherein:

the first active region emits light with a first peak wavelength;

the second active region emits light with a second peak wavelength; and the first peak wavelength is different from the second peak wavelength.

10. The device of claim 1 wherein:

the first active region emits light with a first peak wavelength;

the second active region emits light with a second peak wavelength; and the first peak wavelength is about the same as the second peak wavelength.

11. The device of claim 1 further comprising:

a first contact electrically connected to the first layer of first conductivity type; and a second contact electrically connected to the third layer of second conductivity type.

12. The device of claim 11 further comprising:

a third contact electrically connected to one of the first layer of second conductivity type and the third layer of first conductivity type.

13. The device of claim 11 further comprising:

a submount;

a first interconnect connecting the first contact to the submount; and a second interconnect connecting the second contact to the submount.

14. The device of claim 13 further comprising:

a plurality of leads connected to the submount; and a lens overlying the submount.

15. The device of claim 14 further comprising:

a heat sink disposed between the leads and the submount.

16. The device of claim 11 wherein the second and third contacts are located on a same side of the device.

17. The device of claim 11 wherein the first, second, and third contacts are located on a same side of the device.

18. The device of claim 1 further comprising a wavelength converting material overlying the first active region.

19. The device of claim 18 wherein the wavelength converting material is a phosphor.

20. The device of claim 1 further comprising a wavelength converting material covering a top surface and a side surface of the device.

21. The device of claim 1 wherein the first active region comprises $Al_xIn_yGa_zN$, wherein $0 \leq x \leq 1$, $0 \leq y \leq 1$, $0 \leq z \leq 1$, $x+y+z=1$.

22. The device of claim 1 wherein the second layer of first conductivity type has a thickness less than the first layer of first conductivity type.

23. The device of claim 1 wherein the second layer of second conductivity type has a thickness less than the first layer of second conductivity type.

24. The device of claim 1 wherein the tunnel junction is between the first layer of second conductivity type and the third layer of first conductivity type.

25. A method of operating a light emitting device including a first contact, a first layer of first conductivity type electrically connected to the first contact, a first active region capable of emitting light overlying the first layer of first conductivity type, a first layer of second conductivity type overlying the firs active region, a tunnel junction comprising a second layer of second conductivity type overlying the first layer of second conductivity type and a second layer of first conductivity type overlying the first layer of second conductivity type, a third layer of first conductivity type overlying the second layer of first conductivity type of the tunnel junction, a second active region capable of emitting light overlying the third layer of first conductivity type, a third layer of second conductivity type overlying the second active region, a second contact electrically connected to the third layer of second conductivity type, and a third contact connect to one of the tunnel junction, the first layer of second conductivity type, and the third layer of first conductivity type, the method comprising:

applying a voltage drop across the first and third contacts such that the first active region emits light; and applying a voltage drop across the second and third contacts such that the second active region emits light.

26. The method of claim 25 further comprising applying a voltage drop across the first and second contacts such that the first active region and the second active region emit light.

* * * * *